(12) United States Patent
Shih et al.

(10) Patent No.: US 11,894,299 B2
(45) Date of Patent: Feb. 6, 2024

(54) CONDUCTIVE TRACES IN SEMICONDUCTOR DEVICES AND METHODS OF FORMING SAME

(71) Applicant: Taiwan Semiconductor Manufacturing Co., Ltd., Hsinchu (TW)

(72) Inventors: Chao-Wen Shih, Zhubei (TW); Chen-Hua Yu, Hsinchu (TW); Han-Ping Pu, Taichung (TW); Hsin-Yu Pan, Taipei (TW); Hao-Yi Tsai, Hsinchu (TW); Sen-Kuei Hsu, Kaohsiung (TW)

(73) Assignee: TAIWAN SEMICONDUCTOR LTD, Hsin-Chu (TW)

( * ) Notice: Subject to any disclaimer, the term of this patent is extended or adjusted under 35 U.S.C. 154(b) by 0 days.

(21) Appl. No.: 17/188,787

(22) Filed: Mar. 1, 2021

(65) Prior Publication Data

US 2021/0183760 A1    Jun. 17, 2021

Related U.S. Application Data

(60) Continuation of application No. 15/595,531, filed on May 15, 2017, now Pat. No. 10,937,734, which is a
(Continued)

(51) Int. Cl.
*H01L 23/52* (2006.01)
*H01L 23/525* (2006.01)
(Continued)

(52) U.S. Cl.
CPC ............ *H01L 23/525* (2013.01); *H01L 21/56* (2013.01); *H01L 23/293* (2013.01);
(Continued)

(58) Field of Classification Search
CPC ... H01L 21/56; H01L 23/49811; H01L 23/564
See application file for complete search history.

(56) References Cited

U.S. PATENT DOCUMENTS

| 8,361,842 B2 | 1/2013 | Yu et al. |
| 8,466,059 B2 | 6/2013 | Chang et al. |

(Continued)

FOREIGN PATENT DOCUMENTS

| CN | 102208393 A | 10/2011 |
| CN | 103531578 A | 1/2014 |

(Continued)

*Primary Examiner* — Trang Q Tran
(74) *Attorney, Agent, or Firm* — Slater Matsil, LLP

(57) ABSTRACT

A method includes forming a dielectric layer over a contact pad of a device, forming a first polymer layer over the dielectric layer, forming a first conductive line and a first portion of a second conductive line over the first polymer layer, patterning a photoresist to form an opening over the first portion of the second conductive feature, wherein after patterning the photoresist the first conductive line remains covered by photoresist, forming a second portion of the second conductive line in the opening, wherein the second portion of the second conductive line physically contacts the first portion of the second conductive line, and forming a second polymer layer extending completely over the first conductive line and the second portion of the second conductive line.

20 Claims, 13 Drawing Sheets

Related U.S. Application Data division of application No. 14/688,862, filed on Apr. 16, 2015, now Pat. No. 9,653,406.

(51) Int. Cl.

| | | |
|---|---|---|
| *H01L 23/552* | (2006.01) | |
| *H01L 23/00* | (2006.01) | |
| *H01L 23/522* | (2006.01) | |
| *H01L 23/532* | (2006.01) | |
| *H01L 23/29* | (2006.01) | |
| *H01L 23/31* | (2006.01) | |
| *H01L 21/56* | (2006.01) | |
| *H01L 23/528* | (2006.01) | |
| *H01L 21/768* | (2006.01) | |

(52) U.S. Cl.
CPC ...... *H01L 23/3192* (2013.01); *H01L 23/5225* (2013.01); *H01L 23/5329* (2013.01); *H01L 23/552* (2013.01); *H01L 24/03* (2013.01); *H01L 24/05* (2013.01); *H01L 24/06* (2013.01); *H01L 24/11* (2013.01); *H01L 24/14* (2013.01); *H01L 21/76807* (2013.01); *H01L 21/76816* (2013.01); *H01L 21/76885* (2013.01); *H01L 23/5286* (2013.01); *H01L 24/13* (2013.01); *H01L 2224/0348* (2013.01); *H01L 2224/03462* (2013.01); *H01L 2224/0401* (2013.01); *H01L 2224/05008* (2013.01); *H01L 2224/05009* (2013.01); *H01L 2224/05022* (2013.01); *H01L 2224/05139* (2013.01); *H01L 2224/05144* (2013.01); *H01L 2224/05147* (2013.01); *H01L 2224/05548* (2013.01); *H01L 2224/05569* (2013.01); *H01L 2224/05572* (2013.01); *H01L 2224/11622* (2013.01); *H01L 2224/13022* (2013.01); *H01L 2224/13023* (2013.01); *H01L 2224/13024* (2013.01); *H01L 2224/16104* (2013.01)

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,006,101 B2 | 4/2015 | Chen et al. | |
| 2007/0200241 A1* | 8/2007 | Wu | H01L 23/528 257/E23.151 |
| 2008/0247116 A1 | 10/2008 | Kawano et al. | |
| 2011/0221058 A1 | 9/2011 | Pagaila et al. | |
| 2011/0291288 A1 | 12/2011 | Wu et al. | |
| 2012/0043672 A1 | 2/2012 | Cho et al. | |
| 2012/0175784 A1 | 7/2012 | Lin et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0001638 A1* | 1/2014 | Fu | H01L 21/768 257/E23.079 |
| 2014/0117535 A1 | 5/2014 | Daubenspeck et al. | |
| 2014/0203397 A1 | 7/2014 | Yen et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0155248 A1 | 6/2015 | Lin et al. | |
| 2015/0206855 A1 | 7/2015 | Lin | |
| 2015/0287628 A1* | 10/2015 | You | H01L 23/5329 438/619 |
| 2016/0093566 A1* | 3/2016 | Ting | H01L 21/76808 438/643 |

FOREIGN PATENT DOCUMENTS

| | | |
|---|---|---|
| CN | 103681597 A | 3/2014 |
| JP | 02264432 | 10/1990 |
| JP | 2008235573 A | 10/2008 |
| JP | 2012069718 A | 4/2012 |

\* cited by examiner

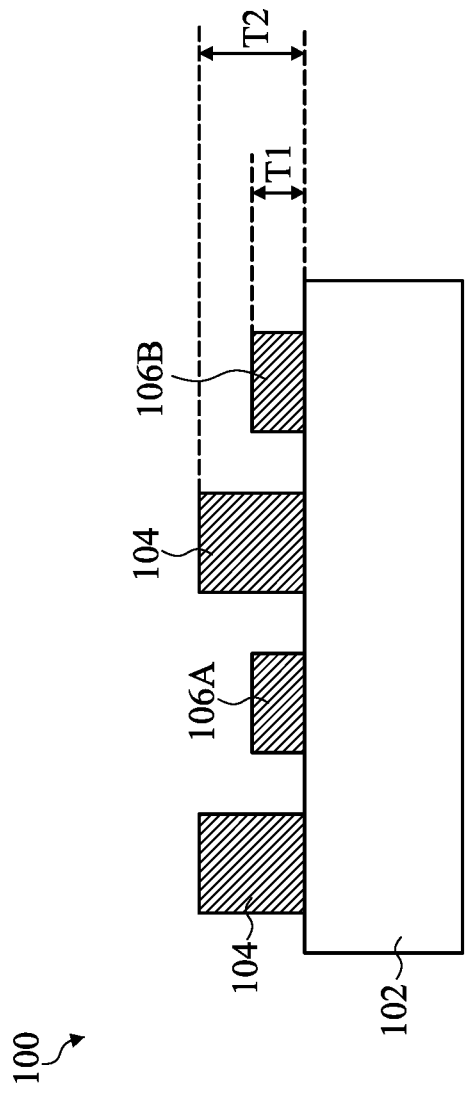
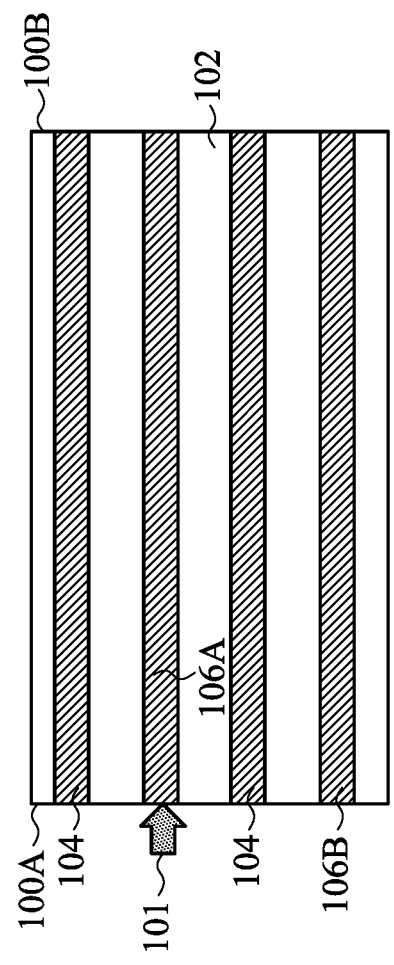

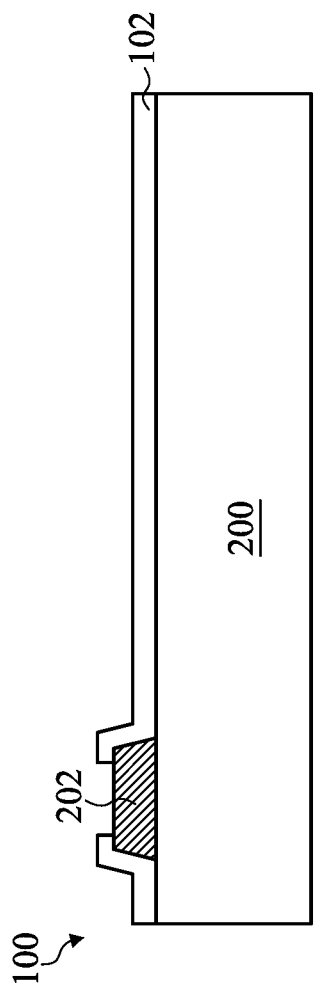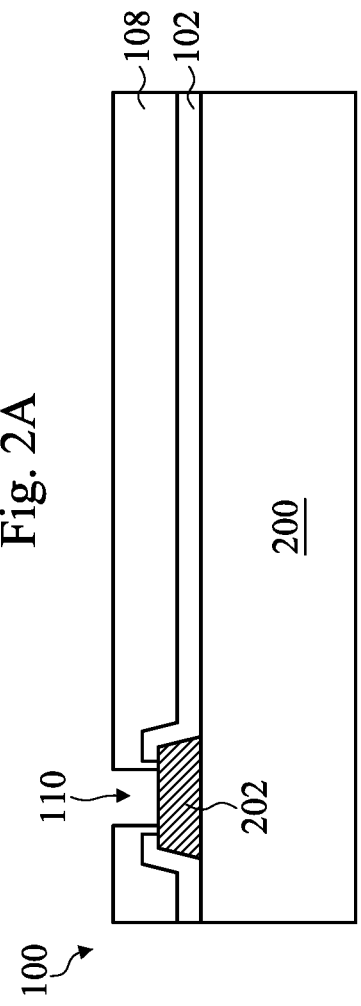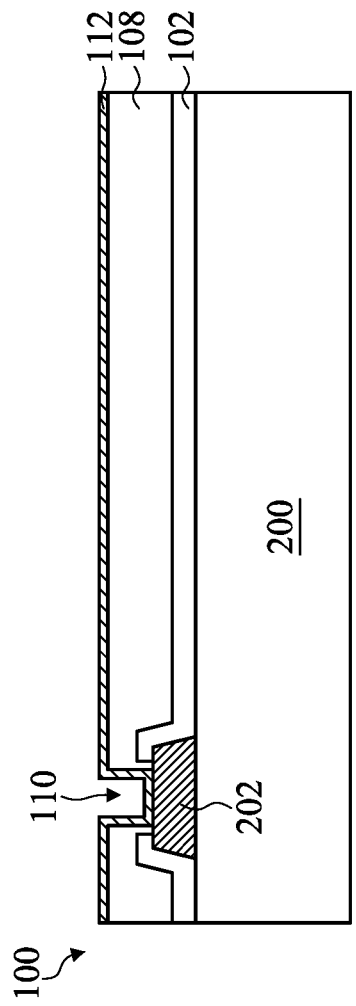

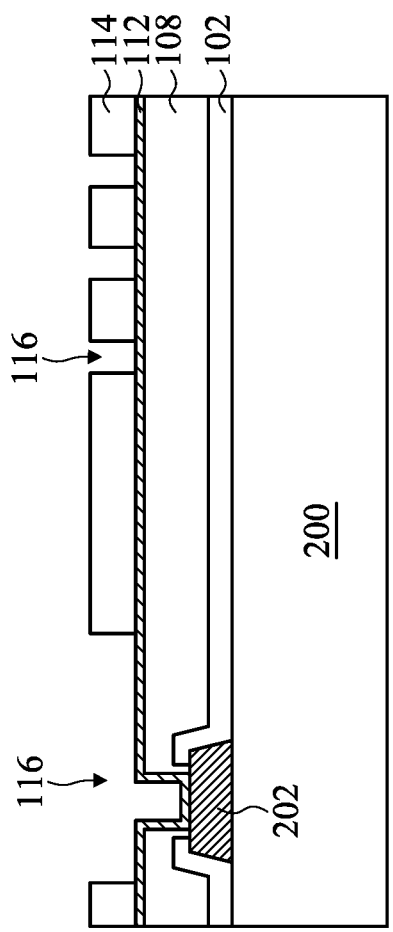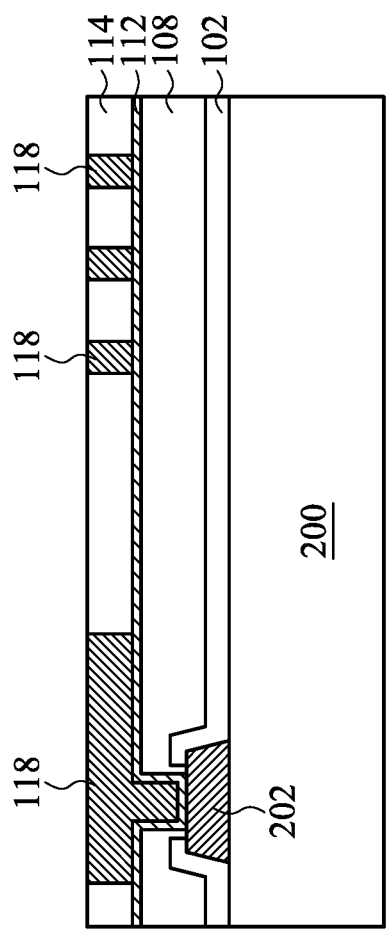

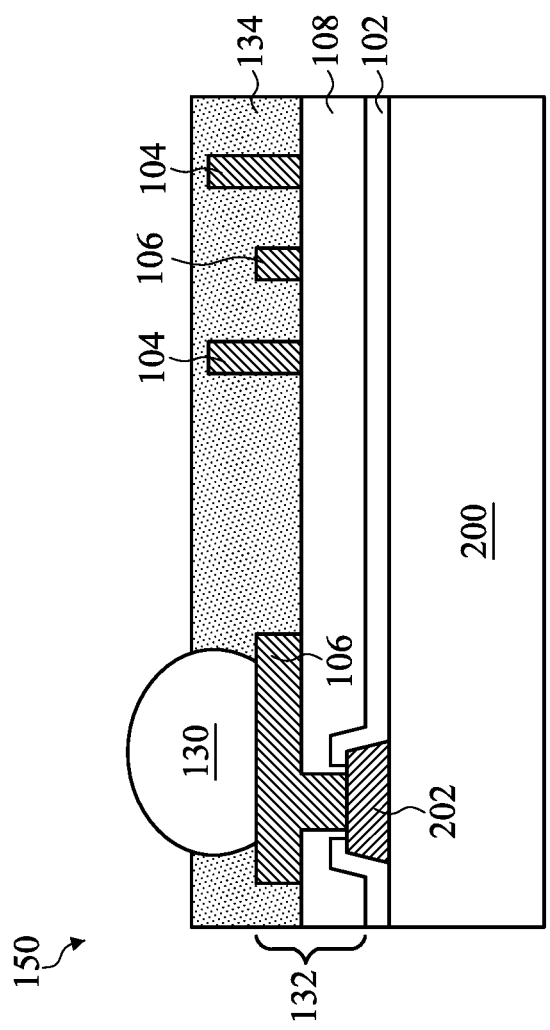

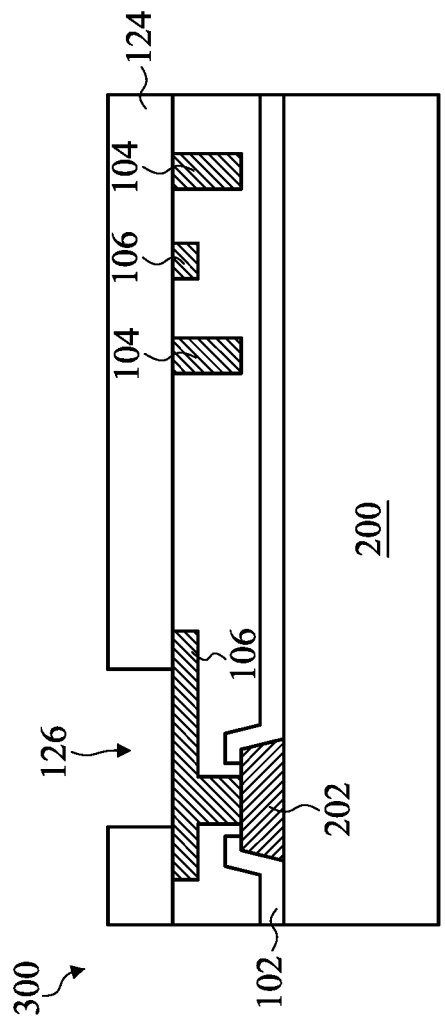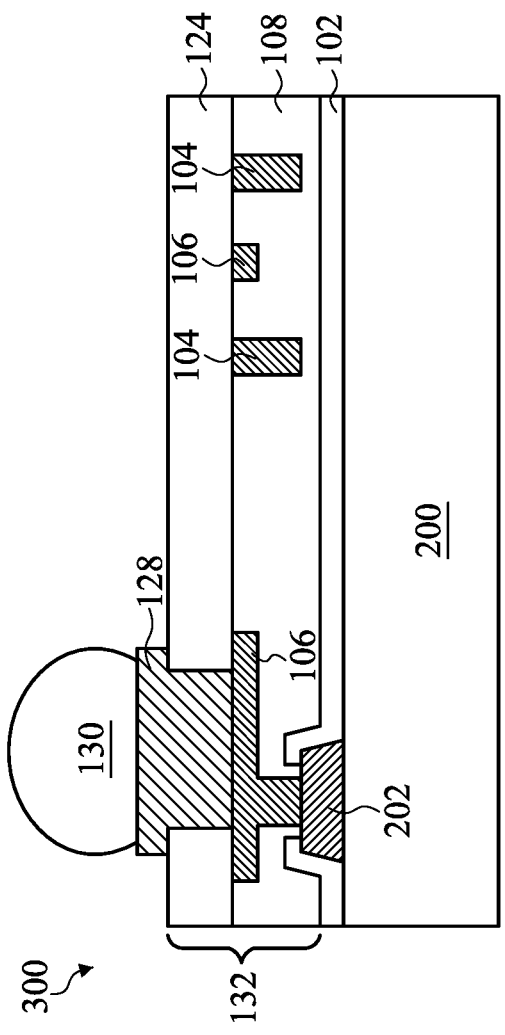

CONDUCTIVE TRACES IN SEMICONDUCTOR DEVICES AND METHODS OF FORMING SAME

PRIORITY CLAIM AND CROSS-REFERENCE

This is a continuation application of U.S. application Ser. No. 15/595,531, entitled "Conductive Traces in Semiconductor Devices and Methods of Forming Same," which was filed on May 15, 2017 and issued as U.S. Pat. No. 10,937,734 on Mar. 2, 2021, which is a divisional application of U.S. application Ser. No. 14/688,862, entitled "Conductive Traces in Semiconductor Devices and Methods of Forming Same," which was filed on Apr. 16, 2015 and issued as U.S. Pat. No. 9,653,406 on May 16, 2017 and is incorporated herein by reference.

BACKGROUND

In an aspect of conventional packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, RDLs typically include one or more polymer layers formed over the die and molding compound. Conductive features (e.g., conductive lines and/or vias) are formed in the polymer layers and electrically connect I/O pads on the die to the external connectors over the RDLs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate a cross-sectional and top-down view of portions of a semiconductor device package in accordance with some embodiments.

FIGS. 2A through 2K illustrates cross-sectional views of varying intermediary steps of manufacturing a semiconductor device package in accordance with some embodiments.

FIG. 3 illustrates a cross-sectional view of a semiconductor device package in accordance with some other embodiments.

FIGS. 4A through 4H illustrates cross-sectional views of varying intermediary steps of manufacturing a semiconductor device package in accordance with some other embodiments.

DETAILED DESCRIPTION

Figure 2F:
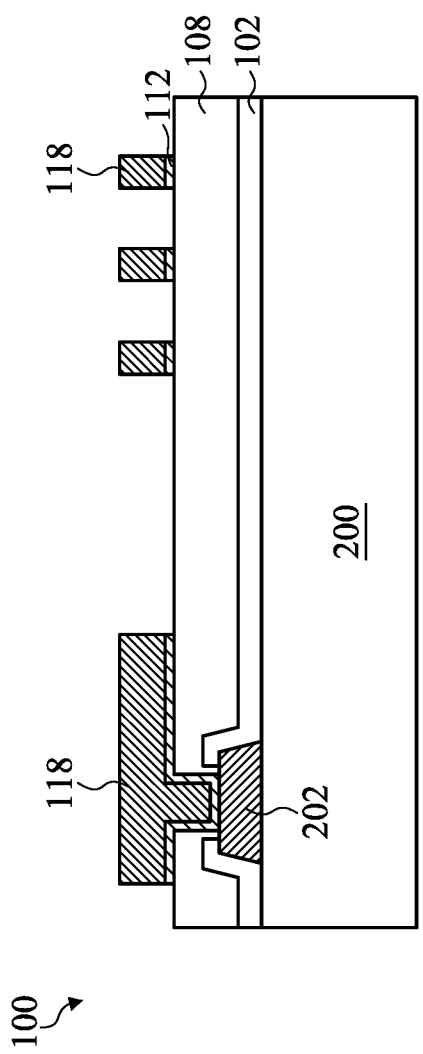

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include post passivation interconnect (PPI) structure (also referred to as redistribution layers (RDLs)) having conductive lines of varying thicknesses over a die. The conductive lines may be formed in a same dielectric layer (e.g., a polymer layer) and include both power/ground and signal lines for the underlying die. In some embodiments, the thick conductive lines (e.g., power/ground lines) surround thin conductive lines (e.g., signal lines) in order to provide a shielding effect to the thin conductive lines, reducing crosstalk and enhancing signal integrity. For example, the thin conductive lines may be disposed between two adjacent thick conductive lines with no other conductive lines disposed therebetween.

FIG. 1A illustrates a cross sectional view of a semiconductor package 100 in accordance with some embodiments. Package 100 includes a passivation layer 102, which may be formed over a semiconductor die (not explicitly illustrated in FIG. 1A). Conductive lines 104 and conductive lines 106 (labeled 106A and 106B) are formed over passivation layer 102. And at least one lateral surface (e.g., a bottom surface in FIG. 1A) of conductive lines 104 and 106 are substantially level. Conductive lines 104 are thicker than conductive lines 106, and conductive lines 104 may provide an electromagnetic (EM) shielding effect for conductive lines 106, reducing crosstalk and enhancing signal integrity. In some embodiments, conductive lines 104 may be power/ground lines while conductive lines 106 may be electrical signal lines.

In some embodiments, a ratio of thickness T1 of conductive lines 104 to thickness T2 of conductive lines 106 may be about 1.5 to about 2.5. For example, conductive lines 104 may have a thickness T1 of about 6 μm to about 25 μm while conductive lines 106 may have a thickness T2 of about 4 μm to about 10 μm. It has been observed that by providing conductive lines of varying thicknesses in the above ratio/ranges, crosstalk between adjacent lines 106 (e.g., 106A/106B) may be reduced. For example, FIG. 1B illustrates a top down view of package 100, which arrow 101 indicating an input signal for conductive line 106A. In experiments conducted with conductive lines 104/106 have thicknesses in the above range, near-end crosstalk (e.g., at a same end 100A of device 100 as input 101) between conductive lines 106A and 106B was reduced by about 3.2 decibels (dBs). In such experiments, far-ended crosstalk (e.g., at a same end 100B of package 100 opposing input 101) between conductive lines 106A and 106B was reduced by about 7.7 dB. Thus, various embodiments use thicker conductive lines (e.g., power/ground lines) for EM shielding of thinner conductive lines (e.g., signal lines) formed in a same device layer.

FIGS. 2A through 2K illustrate cross-sectional views of varying intermediary stages of manufacturing of semiconductor device package 100 in accordance with some embodiments. In FIG. 2A, a device die 200 is provided. Die 200 may be a semiconductor die and could be any type of integrated circuit, such as a processor, logic circuitry, memory, analog circuit, digital circuit, mixed signal, and the like. Die 200 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connects various active devices to form functional circuits within die 200. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

I/O and passivation features may be formed over the interconnect structure. For example, contact pads 202 may be formed over the interconnect structure and may be electrically connected to the active devices through the various conductive features in the interconnect structure. Contact pads 202 may comprise a conductive material such as aluminum, copper, and the like. FIG. 2A illustrates only one contact pad 202 for simplicity only, and die 200 may include any number of contact pads as input/output pads for the functional circuits/active devices of die 200.

Furthermore, a passivation layer 102 may be formed over the interconnect structure and the contact pads. In some embodiments, the passivation layer 102 may be formed of non-organic materials such as silicon oxide, un-doped silicate glass, silicon oxynitride, and the like. Other suitable passivation materials may also be used. Portions of the passivation layer may cover edge portions of contact pads 202. Additional features (not illustrated), such as additional passivation layers, conductive pillars, and/or under bump metallurgy (UBM) layers, may also be optionally formed over contact pads 202. The various features of die 200 may be formed by any suitable method and are not described in further detail herein. Furthermore, the general features and configuration of die 200 described above are but one example embodiment, and die 200 may include any combination of any number of the above features as well as other features.

In FIG. 2B, a polymer layer 108 is formed and patterned over passivation layer 102. In some embodiments, polymer layer 108 may be blanket deposited over a top surface of passivation layer 102 using a spin-on coating process, sputtering, and the like. Polymer layer 108 may comprise polyimide (PI), polybenzoxazole (PBO), benzocyclobuten (BCB), epoxy, silicone, acrylates, nano-filled pheno resin, siloxane, a fluorinated polymer, polynorbornene, and the like. After deposition, polymer layer 108 may be patterned to include openings 110 using photolithography and/or etching processes, for example. Openings 110 in the polymer layer 108 may expose conductive features at a top surface of dies 200, such as contact pads 202.

FIGS. 2C through 2F illustrate the formation of conductive features 118 on polymer layer 108 using any suitable process. In FIG. 2C, a conductive seed layer 112 (e.g., comprising copper, copper, silver, gold, and the like) is formed over a top surface of polymer layer 108. In some embodiments, the seed layer 112 may be deposited using a conformal process (e.g., chemical vapor deposition (CVD), sputtering, and the like), and seed layer 112 may further cover bottom surfaces and sidewalls of openings 110. Seed layer 112 may contact conductive features (e.g., contact pads 202) at a top surface of die 200.

In FIG. 2D, a patterned photoresist 114 may be formed over seed layer 112. For example, photoresist 114 may be deposited as a blanket layer over seed layer 112. Next, portions of photoresist 114 may be exposed using a lithography mask (not shown). Exposed or unexposed portions of photoresist 114 are then removed depending on whether a negative or positive resist is used. The resulting patterned photoresist 114 may include openings 116, which may expose portions of seed layer 112.

FIG. 2E illustrates the filling of openings 116 with a conductive material such as copper, silver, gold, and the like to form conductive features 118. The filling of openings 116 may include electro-chemically plating openings 116 with a conductive material. The conductive material may overfill openings 116, and a planarization process (e.g., a chemical mechanical polish (CMP) or other etch back technique) may be performed to remove excess portions of the conductive material over photoresist 114. Thus, photoresist 114 may be used as a mask to define a shape of conductive features 118.

Subsequently, photoresist 114 may be removed using, for example, a plasma ashing or wet strip process as illustrated in FIG. 2F. Optionally, the plasma ashing process may be followed by a wet dip in a sulfuric acid ($H_2SO_4$) solution to clean package 100 and remove remaining photoresist material.

As further illustrated by FIG. 2F, seed layer 112 is patterned to remove portions of seed layer 112 not covered by conductive features 118. The patterning of seed layer 112 may include a combination of photolithography and etching processes, for example. The resulting conductive features 118 include a remaining portion of seed layer 112, and seed layer 112 is not separately illustrated hereinafter.

Figure 2G:
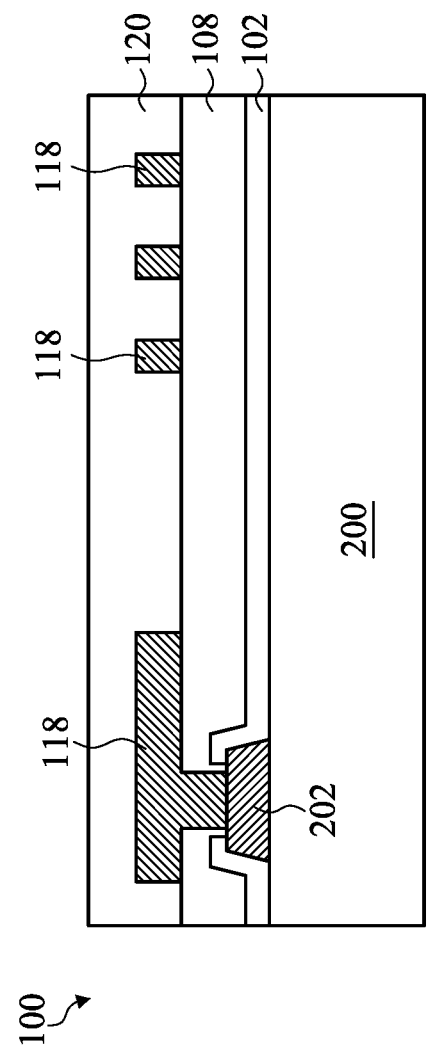
Figure 2H:
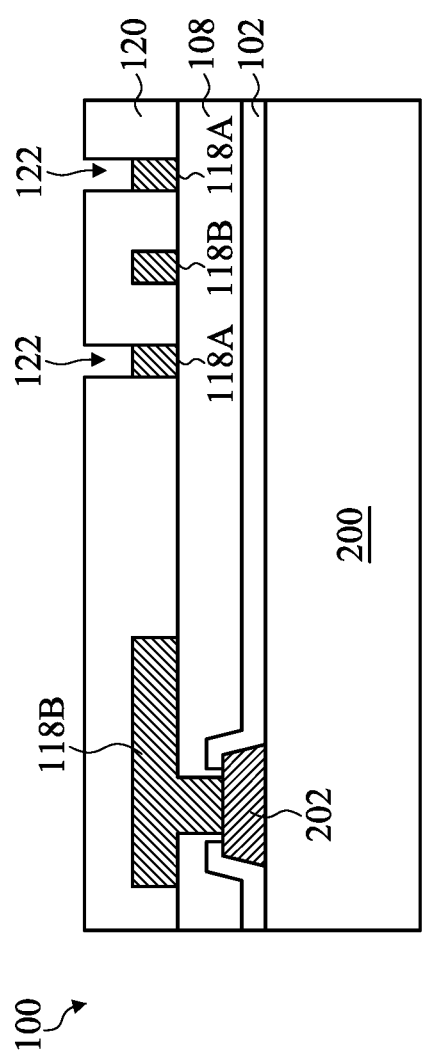

In FIG. 2G, a second photoresist 120 is formed over conductive features 118 and polymer layer 108. Photoresist 120 may be deposited as a blanket layer, and photoresist 120 may extend over and cover top surfaces of conductive features 118. Next, as illustrated by FIG. 2H, photoresist 120 is patterned to include openings 122. The patterning of photoresist 120 may include a similar method as the patterning of photoresist 114 described above. Openings 122 expose a portion of conductive features 118 (labeled 118A). In embodiments, conductive features 118A are selected to be thick conductive lines depending on layout design. Furthermore, conductive features 118A may be adjacent to and/or surround other conductive features 118 (labeled 118B), which remain covered by photoresist 120. Conductive features 118B are selected to be thin conductive lines depending on layout design.

Figure 2I:
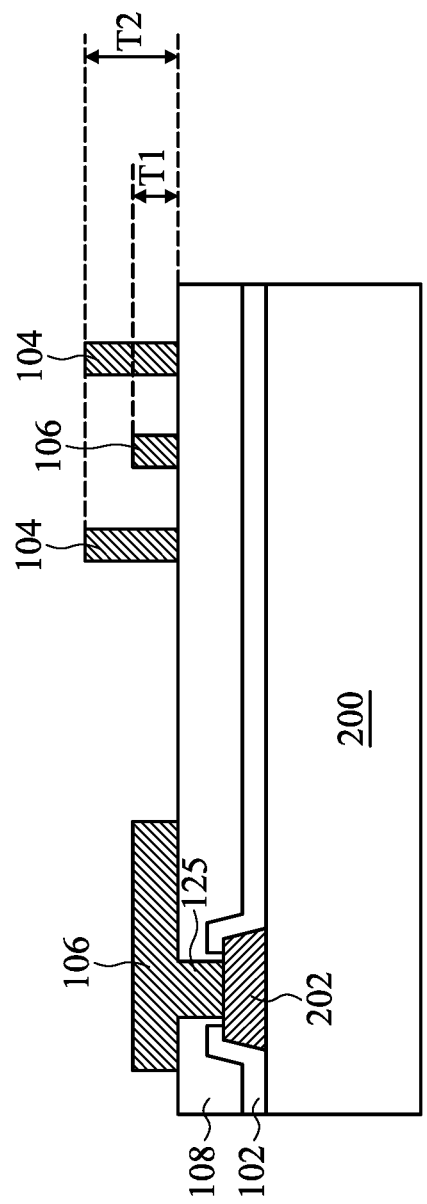

FIG. 2I illustrates the filling of openings 122 with a conductive material such as copper, silver, gold, and the like to form thick conductive lines 104. The filling of openings 122 may include electro-chemically plating openings 116 with a conductive material using conductive features 118B as a seed layer. The conductive material may overfill openings 122, and a planarization process (e.g., a CMP or other etch back technique) may be performed to remove excess portions of the conductive material over photoresist 120. Thus, photoresist 120 may be used as a mask to define a shape of thick conductive lines 104. Subsequently, photoresist 120 may be removed using, for example, a plasma ashing or wet strip process as also illustrated in FIG. 2I. Optionally, the plasma ashing process may be followed by a wet dip in a sulfuric acid ($H_2SO_4$) solution to clean package 100 and remove remaining photoresist material.

The resulting structure includes thin conductive lines 106 and thick conductive lines 104 formed on polymer layer 108. For example, a top surface of polymer layer 108 may be substantially level with bottom surfaces of conductive lines 104 and 106. Conductive lines 104 and 106 are electrically connected to die 200 using conductive vias (e.g., via 125) extending through polymer layer 108. In some embodiments, conductive lines 106 may be power/ground lines while conductive lines 104 are signal lines for underlying die 200. Conductive lines 106 may have a thickness T1 of about 4 μm to about 10 μm, for example. Conductive lines 104 may have a thickness T2 of about 6 μm to about 25 μm, for example. Of course the dimensions recited herein are merely examples, and other embodiments may include conductive lines of different thicknesses depending on device design. In some embodiments, a ratio of thickness T1 to thickness T2 may be about 1.5 to about 2.5. It has been observed that by providing conductive lines of varying thicknesses in this ratio range, conductive lines 106 may act as a shield for conductive lines 104, which reduces crosstalk and improves signal integrity as described above.

Figure 2J:
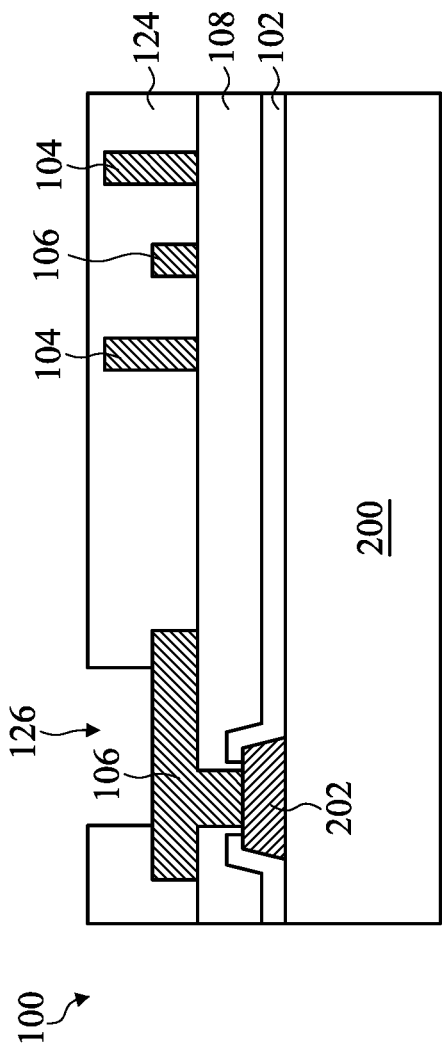

Next, in FIG. 2J, an additional polymer layer 124 is formed over conductive lines 104 and 106. Polymer layer 124 may be similar to polymer layer 108, and polymer layer 124 may be blanket deposited to cover a top surface of conductive lines 104 and 106 as a protective layer. Subsequently, a patterning process (e.g., comprising photolithography and/or etching) is used to form openings 126 in polymer layer 124, exposing portions of conductive lines 106 or 104.

Figure 2K:
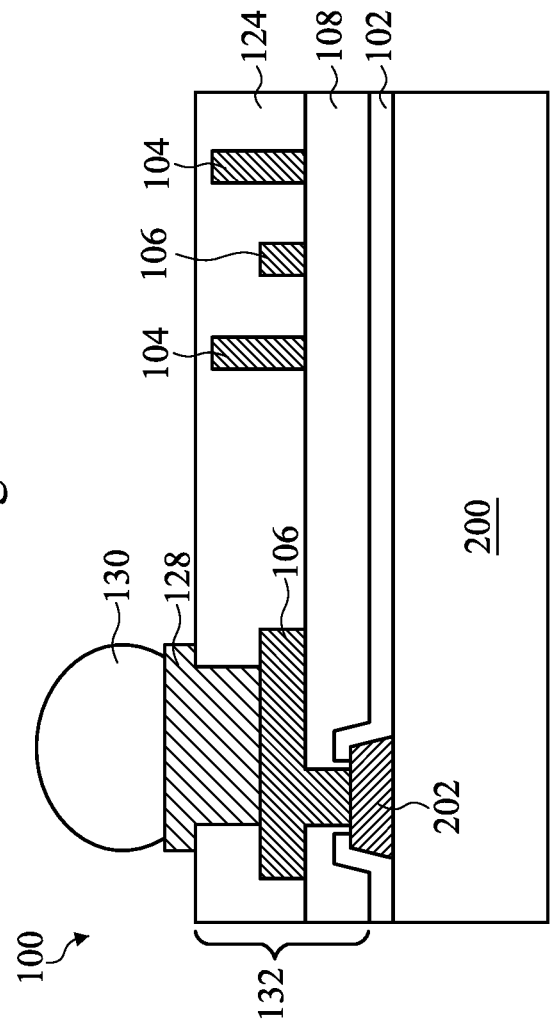

Next, in FIG. 2K, under bump metallurgies (UBMs) 128 are formed in openings 126 and electrically connected to die 200 by conductive lines 104 and 106. External connectors 130 are formed over UBMs 128. Connectors 130 may include ball grid array (BGA) balls, controlled collapse chip connection (C4) bumps, and the like. Connectors 130 may be electrically connected to die 200 by way of conductive lines 104 and 106. Connectors 130 may be used to electrically connect dies 200 to other package components such as another device die, interposers, package substrates, printed circuit boards, a mother board, and the like.

Thus, a PPI structure 132 (sometimes also referred to as RDLs 132) is formed over die 200. PPI structure 132 includes conductive lines 104 and 106 of varying thicknesses, which electrically connect underlying die 200 to external connectors 130. Although not explicitly illustrated in the figures, PPI structure 132 may extend laterally past edges of die 200 to form fan-out interconnect structures in some embodiments. In such embodiments, a molding compound may be formed around die 200, and PPI structure 132 may also be formed on a top surface of the molding compound. Furthermore, although PPI structure 132 is illustrated as only having one layer of conductive lines, other embodiments may include any number of conductive line layers formed over one or more dies.

FIG. 3 illustrates a package 150 in accordance with an alternative embodiment. Package 150 may be similar to package 100 where like reference numerals indicate like elements. However, in package 150, polymer layer 124 and UBMs 128 may be excluded. Connector 130 is directly disposed on a topmost conductive line 104 and/or 106. Subsequently, a protective layer 134 (e.g., comprising a polymer or a molded underfill) may be formed over conductive lines 104 and 106. Protective layer 134 may further extend at least partially along sidewalls of connector 130. Protective layer 134 may be formed using any suitable process, such as, lamination, a spin-on process, and the like.

Figure 4A:
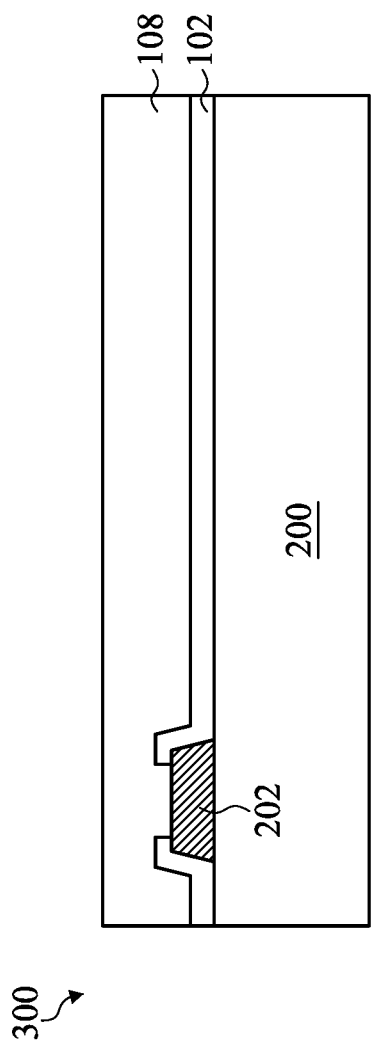

FIGS. 4A through 4H illustrate cross sectional views of intermediary stages of manufacturing a package 300 having embedded conductive lines in accordance with other embodiments. Package 300 may be similar to package 100 where like references indicate like elements. In FIG. 4A, a die 200 having a passivation layer 102 as described above is provided. A polymer layer 108 is formed over a passivation layer 102. Polymer layer 108 may be blanket deposited over passivation layer 102 as described above. In some embodiments, polymer layer 108 may include a photosensitive polymer.

Figure 4B:
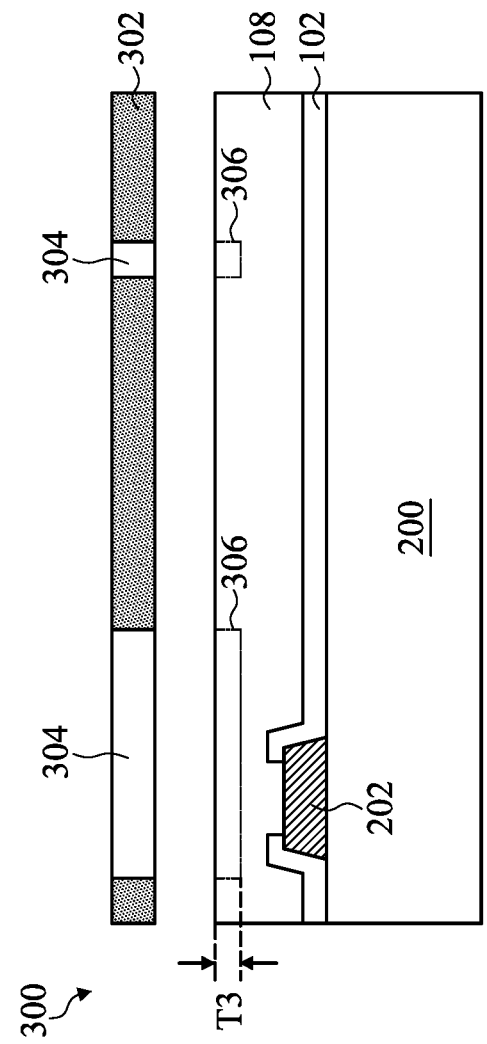
Figure 4C:
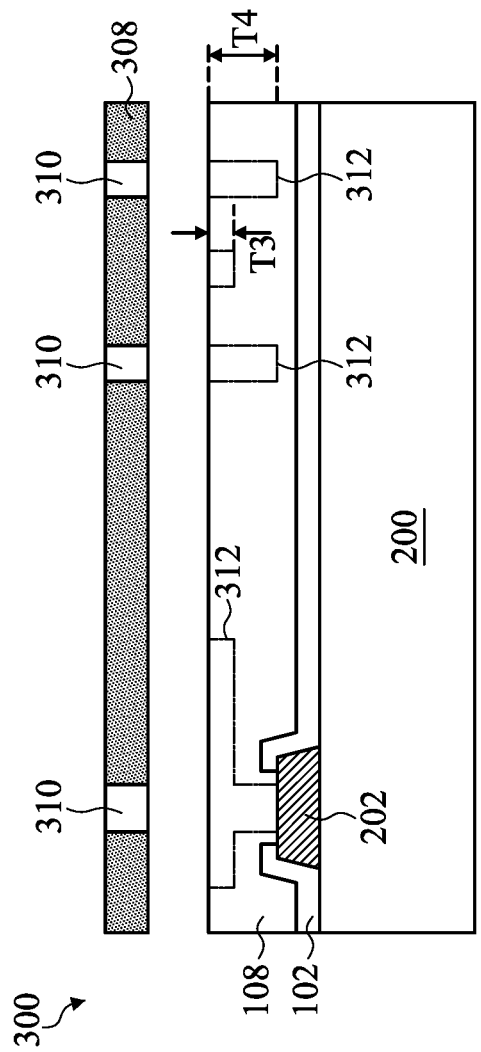
Figure 4D:
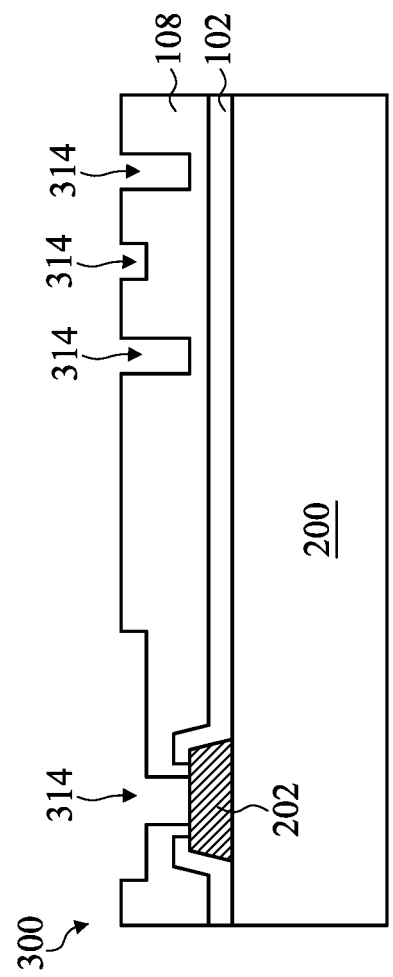

FIGS. 4B through 4D illustrate the patterning of polymer layer 108. In some embodiments, polymer layer 108 is a photosensitive material that is exposed and developed using lithography techniques. Polymer layer 108 may be exposed in two stages using two lithography masks. First, as illustrated by FIG. 4B, a first lithography mask 302 is used, wherein lithography mask 302 includes opaque portions for blocking the light that is used for exposing, and transparent portions 304 for allowing the light to pass through. A pattern of transparent portions 304 is transferred to polymer layer 108 using lithography techniques, forming exposed portions 306. In some embodiments, the conditions of the lithography process are selected to control a depth of the exposed portions 306 of polymer layer 108. For example, energy levels of the light applied during lithography may be controlled so that exposed portions 306 of polymer layer 108 only extend partially into polymer layer 108 to a thickness T3. In some embodiments, thickness T3 may correspond to a thickness T1 of thin conductive lines 106 (see e.g., FIG. 2I). For example, thickness T3 may be about 4 µm to about 10 µm.

Second, as illustrated by FIG. 4C, a second lithography mask 308 is used during a second exposure process. Lithography mask 308 includes opaque portions for blocking the like hat is used for exposing, and transparent portions 310 for allowing the light to pass through. A pattern of transparent portions 310 is transferred to polymer layer 108 using lithography techniques, and the exposed portions 312 are formed in polymer layer 108. The conditions of the second lithography process are selected to control a depth of the second exposure so that parts of exposed portions 312 of polymer layer 108 extend to a thickness T4 and reach contact pads 202 of die 200. In some embodiments, thickness T4 may correspond to a thickness T2 of thick conductive lines 104 (see e.g., FIG. 2I). For example, thickness T4 may be about 6 µm to about 25 µm. Exposed portions 312 include exposed portions 306 (see FIG. 4B) formed using the first lithography mask. Opaque portions of lithograph mask 308 may at least partially cover exposed portions 306 during lithography. Thus, exposed portion 312 of polymer layer 108 extends to different depths T3 and T4.

Subsequently, as illustrated by FIG. 4D, polymer layer 108 is developed and exposed portions 312 of polymer layer 108 are removed. Thus, openings 314 are formed in polymer layer 108. By using of two lithography masks and controlling the exposure conditions, openings 314 may extend to vary depths in polymer layer 108. At least a portion of openings 314 may expose contact pads 202 of die 200. In such embodiments, a pattern of lithography masks 302 and 308 are selected in accordance with a desired placement of thin and thick conductive lines in polymer layer 108 according to layout design.

Figure 4E:
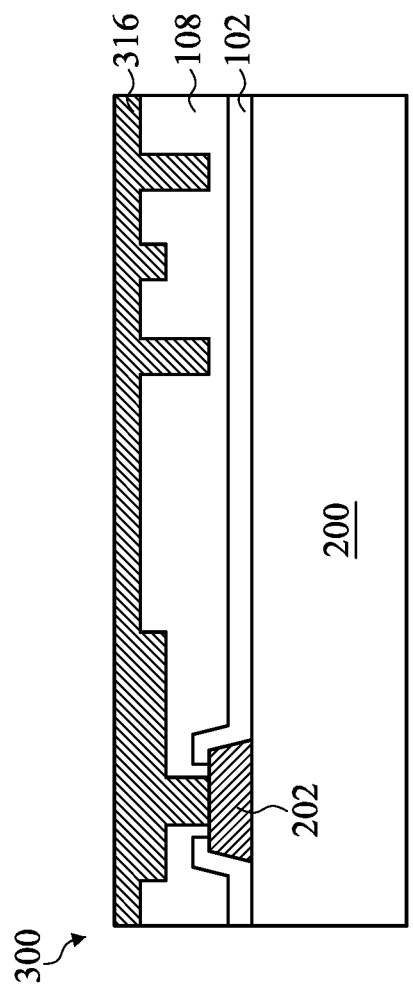
Figure 4F:
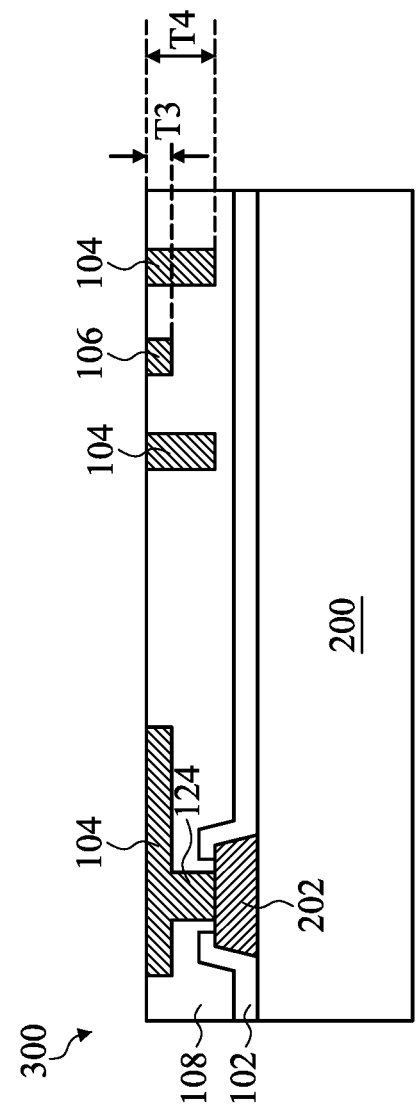

In FIG. 4E, openings 314 are filled with a conductive material 316, such as copper, silver, gold, and the like. The filling of openings 314 may include first depositing a conductive seed layer (not separately illustrated) and electrochemically plating openings 314 with a conductive material. The conductive material may overfill openings 314, and a planarization process (e.g., a CMP or other etch back technique) may be performed to remove excess portions of the conductive material over polymer layer 108 as illustrated by FIG. 4F.

Thus, thick conductive lines 104 and thin conductive lines 106 may be embedded in polymer layer 108. For example, top surfaces of polymer layer 108, thin conductive lines 106, and thick conductive lines 104 may be substantially level. Conductive lines 104 have a thickness T4 (e.g., about 6 µm to about 25 µm), which is thicker than a thickness T3 (e.g., about 4 µm to about 10 µm) of thin conductive lines 106. As explained above, the use of varying thicknesses allows thick conductive lines 104 to provide a shielding effect, improving signal integrity. In some embodiments, thick conductive lines 104 may include power/ground lines while thin conductive lines 106 includes signal lines. Conductive lines 104 and 106 may be electrically connected to underlying die 200 by conductive vias (e.g., via 125) also formed in polymer layer 108.

Next, in FIG. 4G, an additional polymer layer 124 is formed over conductive lines 104 and 106. Polymer layer 124 may be similar to polymer layer 108, and polymer layer 124 may be blanket deposited to cover a top surface of conductive lines 104 and 106 as a protective layer. Subsequently, a patterning process (e.g., comprising photolithography and/or etching) is used to form openings 126 in polymer layer 124. Openings 126 expose portions of conductive lines 106 or 104.

In FIG. 4H, UBMs 128 are formed in openings 126 and electrically connected to die 200 by conductive lines 104 and 106. External connectors 130 are formed over UBMs 128 as described above. Connectors 130 may be used to electrically connect dies 200 to other package components such as another device die, interposers, package substrates, printed circuit boards, a mother board, and the like. Thus, a PPI structure 132 (sometimes also referred to as RDLs 132) is formed over die 200. PPI structure 132 includes conductive lines 104 and 106 of varying thicknesses, which electrically connect underlying die 200 to external connectors 130. Conductive lines 104 and 106 are embedded in a polymer layer 108.

Figure 5:
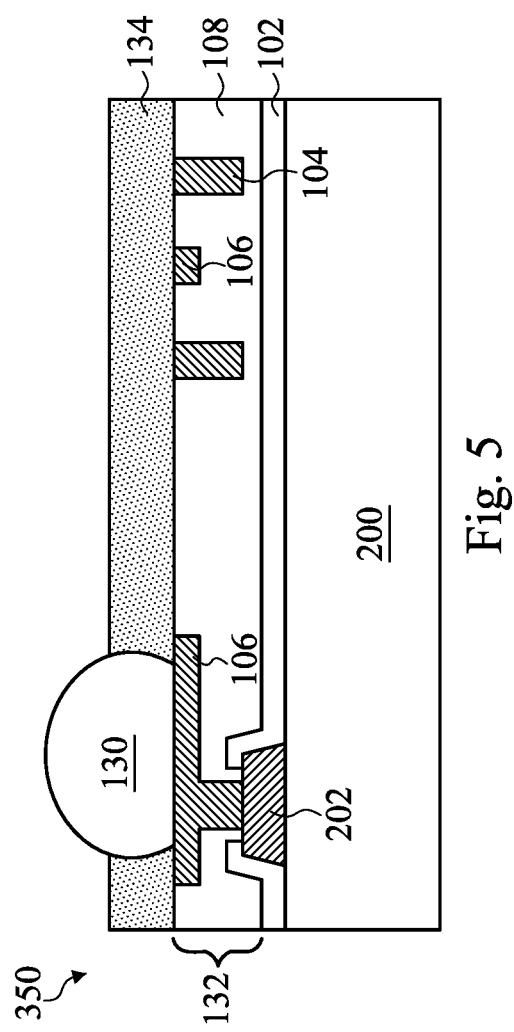
FIG. 5 illustrates a cross-sectional view of a semiconductor device package in accordance with some other embodiments.

FIG. 5 illustrates a package 350 in accordance with an alternative embodiment. Package 350 may be similar to package 300 where like reference numerals indicate like elements. However, in package 350, polymer layer 124 and UBMs 128 may be excluded. Connector 130 is directly disposed on a topmost conductive line 104 and/or 106. Subsequently, a protective layer 134 (e.g., comprising a polymer or a molded underfill) may be formed over conductive lines 104 and 106. Protective layer 134 may further extend at least partially along sidewalls of connector 130. Protective layer 134 may be formed using any suitable process, such as, lamination, a spin-on process, and the like.

Figure 6:
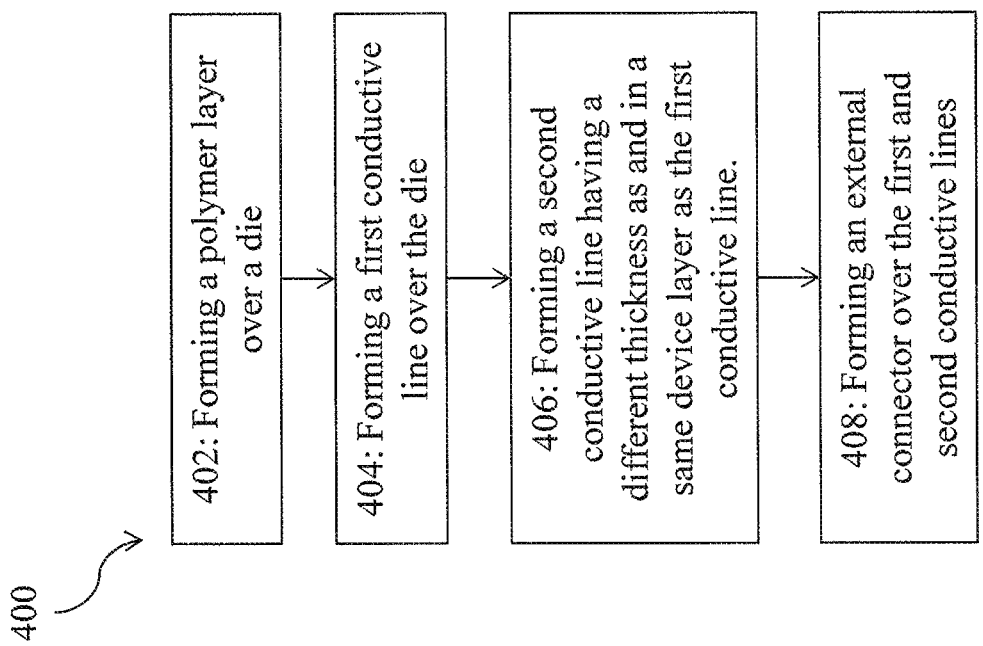
FIG. 6 illustrates a process flow for forming a semiconductor device package in accordance with some embodiments.

FIG. 6 illustrates a process flow 400 for forming a device package in accordance with various embodiments. In step 402, a polymer layer (e.g., polymer layer 108) is formed over a die. The polymer layer may be formed over a passivation layer (e.g., passivation layer 102) at a top surface of the die. In steps 404 and 406, a first conductive line (e.g., conductive line 104) and a second conductive line (e.g., conductive line 106) having different thicknesses are formed in a same device layer over the die. In some embodiments, (e.g., as illustrated by FIGS. 2A through 2K), the first and second conductive lines are formed on a top surface of the polymer layer. In such embodiments, two photoresists may be formed over the polymer layer during two electrochemical plating processes to form the lines. In other embodiments (e.g., as illustrated by FIGS. 4A through 4H), the conductive lines may be embedded in the polymer layer. In such embodiments, the method may include performing two exposures on the polymer layer using two different lithography masks to form the lines. In step 408, an external connector (e.g., connector 130) is formed over the conductive lines. The external connector may be directly disposed on the conductive line or the external connector may be disposed on a UBM (e.g., UBM 128) may be formed over the conductive line.

Thus, an embodiment PPI structure includes conductive lines of varying thicknesses is formed in a same device layer over a semiconductor device die. For example, the conductive lines may be formed on a top surface of a polymer layer or embedded within the polymer layer. The conductive lines may include thick conductive lines (e.g., power/ground lines) adjacent thin conductive lines (e.g., signal lines) in order to provide a shielding effect to the thin conductive lines, reducing crosstalk and enhancing signal integrity.

Additional features, such as UBMs and/or external connectors may be formed over the conductive lines.

In an embodiment, a method for forming a semiconductor device includes depositing a passivation layer over a die, the passivation layer physically contacting the device die; depositing a first polymer layer over the passivation layer, the polymer layer physically contacting the passivation layer; forming a first conductive feature and a second conductive feature at the same time, the first conductive feature and a second conductive feature physically contacting the top surface of the first polymer layer, wherein the first conductive feature is part of a conductive signal line and the second conductive feature is part of a conductive power line; after forming the first conductive feature and the second conductive feature, forming a third conductive feature over and physically contacting the second conductive feature; and depositing a second polymer layer over the first polymer layer, the second polymer layer physically contacting the top surface of the first polymer layer, a sidewall of the first conductive feature, a sidewall of the second conductive feature, and a sidewall of the third conductive feature. In an embodiment, the method further includes forming an external connector over and electrically connected to the first conductive feature. In an embodiment, the method further includes forming a contact pad over and electrically connected to the die, wherein the first conductive feature is electrically connected to the contact pad. In an embodiment, the first conductive feature extends a first height above the top surface of the first polymer layer, the first height is between about 4 µm and about 10 µm, and the third conductive feature extends a second height above the top surface of the polymer layer, wherein the second height is between about 6 µm and about 25 µm. In an embodiment, a ratio of the second height to the first height is between about 1.5 and about 2.5. In an embodiment, the method further includes forming a fourth conductive feature at the same time as forming the first conductive feature and the second conductive feature, the fourth conductive feature physically contacting the top surface of the first polymer layer. In an embodiment, the method further includes forming a fifth conductive feature over and physically contacting the fourth conductive feature at the same time as forming the third conductive feature. In an embodiment, the first conductive feature is disposed between the second conductive feature and the fourth conductive feature. In an embodiment, the first conductive feature and the second conductive feature extend the same height above the first polymer layer.

In an embodiment, a method includes forming a first contact pad on the top surface of a semiconductor device, wherein the first contact pad is electrically connected to the semiconductor device; forming a dielectric layer over the contact pad; forming a first polymer layer over the dielectric layer; forming a first conductive line and a first portion of a second conductive line over the first polymer layer, wherein the first conductive line extends through the polymer layer and the dielectric layer to physically contact the contact pad, and wherein the first conductive line and the first portion of the second conductive line physically contact the top surface of the first polymer layer; patterning a photoresist to form an opening over the first portion of the second conductive feature, wherein after patterning the photoresist the first conductive line remains covered by photoresist; forming a second portion of the second conductive line in the opening, wherein the second portion of the second conductive line physically contacts the first portion of the second conductive line; and forming a second polymer layer extending completely over the first conductive line and the second portion of the second conductive line, wherein the second polymer layer covers the sidewalls of the first conductive line and the sidewalls of the first portion of the second conductive line. In an embodiment, the method further includes forming a first external connector, the first external connector electrically connected to the first conductive line. In an embodiment, the method further includes forming an under-bump metallurgy (UBM) in the second polymer layer, wherein the first external connector is disposed on the UBM. In an embodiment, forming a first conductive line and a first portion of a second conductive line includes forming a seed layer over the first polymer layer. In an embodiment, the method further includes forming a second contact pad on the top surface of the semiconductor device, wherein the second contact pad is electrically connected to the semiconductor device and to the second conductive line. In an embodiment, the method further includes forming a first external connector, the first external connector electrically connected to the second conductive line.

In an embodiment, a method of forming a device includes depositing a passivation layer over a die having a contact pad; depositing a first polymer layer over the passivation layer; forming an opening in the first polymer layer to expose the contact pad; depositing a first photoresist layer over the first polymer layer; patterning a first plurality of openings in the first photoresist layer to expose the first polymer layer; depositing a first conductive material into the first plurality of openings to form a first plurality of conductive features, wherein a portion of the conductive material extends into the opening in the first polymer layer to contact the contact pad; depositing a second photoresist layer over the first polymer layer; patterning a second plurality of openings in the second photoresist layer to expose at least one of the first plurality of conductive features, wherein at least one of the first plurality of conductive features remains covered by the second photoresist layer; and depositing a second conductive material into the second plurality of openings. In an embodiment, the method further includes forming a second polymer layer over the first polymer layer, wherein the second polymer layer extends completely over the first plurality of conductive features. In an embodiment, the method further includes forming an under-bump metallurgy (UBM) in the second polymer layer, wherein the UBM is electrically connected to at least one of the first plurality of conductive features. In an embodiment, the method further includes forming an external connector over the UBM, wherein the external connector is electrically connected to the contact pad. In an embodiment, the first plurality of conductive features have a thickness between about 4 µm and about 10 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device comprising:
   forming a first insulating layer over a substrate, wherein the first insulating layer is a photosensitive material;
   exposing a first portion and a second portion of the first insulating layer in a first exposure process;
   exposing a third portion of the first insulating layer in a second exposure process, wherein the third portion does not overlap the first portion and the second portion;
   after exposing the first portion, the second portion, and the third portion, removing the first portion, the second portion, and the third portion to form a first recess, a second recess, and a third recess, respectively, wherein the third recess has a different depth than the first recess and the second recess;
   forming a conductive material in the first recess, the second recess, and the third recess to form a first conductive line in the first recess, a second conductive line in the second recess, and a third conductive line in the third recess; and
   depositing a second insulating layer over the first insulating layer.

2. The method of claim 1, wherein the third conductive line comprises a signal line, wherein the first conductive line and the second conductive line comprise power/ground lines.

3. The method of claim 1, wherein a depth of the first recess and a depth of the second recess is greater than a depth of the third recess.

4. The method of claim 1, wherein the first recess and the second recess extends only partially through the first insulating layer.

5. The method of claim 1, wherein the third conductive line is interposed between the first conductive line and the second conductive line.

6. The method of claim 1, wherein the second insulating layer extends over an upper surface of the first conductive line, the second conductive line, and the third conductive line.

7. The method of claim 1, wherein the substrate comprises a conductive feature, further comprising:
   exposing a fourth portion of the first insulating layer simultaneously as exposing the first portion and the second portion;
   removing the fourth portion to form a fourth recess; and
   forming the conductive material in the fourth recess, wherein the conductive material in the fourth recess contacts the conductive feature.

8. A method for forming a semiconductor device comprising:
   forming a first insulating layer over a substrate, the substrate having a conductive feature;
   exposing a first portion and a second portion of the first insulating layer;
   exposing a third portion and a fourth portion of the first insulating layer, wherein the fourth portion overlaps the first portion;
   removing the first portion, the second portion, the third portion, and the fourth portion to form a first recess, a second recess, a third recess, and a fourth recess, respectively, wherein the fourth recess exposes the conductive feature, wherein the first recess, the second recess, and the third recess extends only partially through the first insulating layer;
   forming a conductive material in the first recess, the second recess, the third recess, and fourth recess to form a first conductive line in the first recess, a second conductive line in the second recess, a third conductive line in the third recess, and a conductive via in the fourth recess; and
   depositing a second insulating layer over the first insulating layer.

9. The method of claim 8, wherein the second insulating layer extends over an upper surface of the first conductive line, the second conductive line, and the third conductive line.

10. The method of claim 8, further comprising:
    forming an opening through the second insulating layer;
    forming an under bump metallization in the opening; and
    forming a connector on the under bump metallization.

11. The method of claim 8, wherein a depth of the second recess is less than a depth of the third recess.

12. The method of claim 8, wherein exposing the first portion and the second portion is performed prior to exposing the third portion and the fourth portion.

13. The method of claim 8, wherein:
    exposing the third portion and the fourth portion of the first insulating layer comprises exposing a fifth portion of the first insulating layer,
    removing the first portion, the second portion, the third portion, and the fourth portion comprises removing the fifth portion to form a fifth recess,
    forming the conductive material comprises forming the conductive material in the fifth recess to form a fourth conductive line, and
    the second conductive line is a signal line interposed between the third conductive line and the fourth conductive line.

14. The method of claim 13, wherein the third conductive line and the fourth conductive line are power/ground lines.

15. The method of claim 14, wherein a thickness of the power/ground lines is greater than a thickness of the signal line.

16. A method for forming a semiconductor device comprising:
    forming a first insulating layer over a substrate, the substrate having a conductive feature;
    removing portions of the first insulating layer to simultaneously form a first recess, a second recess, and a third recess in the first insulating layer, wherein bottom surfaces of the first recess, the second recess, and the third recess are a surface of the first insulating layer, wherein a depth of the first recess is different than a depth of the second recess;
    forming a conductive material in the first recess, the second recess, and the third recess to form a first conductive line in the first recess, a second conductive line in the second recess, and a third conductive line in the third recess, wherein the second conductive line comprises a signal line, wherein the first conductive line and the third conductive line comprise power/ground lines; and
    depositing a second insulating layer over the first insulating layer.

17. The method of claim 16, further comprising, prior to removing portions of the first insulating layer:
    using a first lithography process to expose the first insulating layer according to a pattern for the first recess and the third recess; and using a second lithography process to expose the first insulating layer according to a pattern for the second recess.

18. The method of claim 16, further comprising removing portions of the first insulating layer to form a fourth recess simultaneously with removing portions of the first insulating layer to form the first recess and the third recess, wherein the fourth recess exposes the conductive feature.

19. The method of claim 18, further comprising:
removing portions of the first insulating layer to form a fifth recess in the first insulating layer simultaneously with removing portions of the first insulating layer to form the second recess, the fifth recess overlapping the fourth recess;
forming the conductive material in the fifth recess and the fourth recess to form a fourth conductive line and a conductive via extending from the fourth conductive line to the conductive feature, respectively;
after depositing the second insulating layer, forming an opening in the second insulating layer; and
forming an external connection in the opening, the external connection contacting the fourth conductive line.

20. The method of claim 16, wherein the first conductive line and the third conductive line has a thickness in a range of 6 μm to 25 μm, wherein the second conductive line has a thickness in a range of 4 μm to 10 μm.

* * * * *

UNITED STATES PATENT AND TRADEMARK OFFICE
CERTIFICATE OF CORRECTION

PATENT NO. : 11,894,299 B2
APPLICATION NO. : 17/188787
DATED : February 6, 2024
INVENTOR(S) : Shih et al.

It is certified that error appears in the above-identified patent and that said Letters Patent is hereby corrected as shown below:

On the Title Page

Item (73), in Column 1, in "Assignee", Line 1, delete "LTD," and insert -- MANUFACTURING COMPANY, LTD., --.

Signed and Sealed this
Seventh Day of May, 2024

Katherine Kelly Vidal
*Director of the United States Patent and Trademark Office*